(12) United States Patent  (10) Patent No.: US 6,710,252 B2
Kanbach  (45) Date of Patent: Mar. 23, 2004

(54) METHOD FOR CONNECTING FLAT FILM CABLES

(75) Inventor: Helmut Kanbach, Seligenstadt (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 10/399,087

(22) PCT Filed: Aug. 31, 2001

(86) PCT No.: PCT/EP01/10050
§ 371 (c)(1),
(2), (4) Date: Aug. 21, 2003

(87) PCT Pub. No.: WO02/31922
PCT Pub. Date: Apr. 18, 2002

(65) Prior Publication Data
US 2004/0026116 A1 Feb. 12, 2004

(30) Foreign Application Priority Data
Oct. 13, 2000 (DE) .......................................... 100 50 798

(51) Int. Cl.⁷ ................................................ H01B 7/08
(52) U.S. Cl. .............................. 174/117 FF; 174/88 R; 29/843
(58) Field of Search ........................ 174/117 F, 117 FF, 174/88 R; 29/843, 860, 884, 878, 879; 219/603, 605

(56) References Cited

U.S. PATENT DOCUMENTS

| | | | |
|---|---|---|---|
| 5,673,480 A | | 10/1997 | Buchheister, Jr. et al. .... 29/483 |
| 5,970,608 A | * | 10/1999 | Tighe et al. ................... 29/843 |
| 6,226,862 B1 | * | 5/2001 | Neuman ....................... 29/830 |

FOREIGN PATENT DOCUMENTS

| | | |
|---|---|---|
| EP | 0 371 646 A1 | 11/1989 |
| JP | 07326404 A | 12/1995 |
| JP | 11149951 A | 6/1999 |

* cited by examiner

Primary Examiner—Chau N. Nguyen
(74) Attorney, Agent, or Firm—Crowell & Moring LLP

(57) ABSTRACT

In a method for connecting two flat laminated cable ends, a metal strip, tin-plated with a solder coating, is placed transversely over the conductor tracks between the two flat laminated cable ends which have been stripped of insulation on one side. The flat laminated cable ends are pressed onto each other with the tin-plated metal strip lying in between, and current is applied to the metal strip. The latter is heated until the solder of the metal strip melts and enters into a soldered connection with the conductor tracks of the flat laminated cables. The metal strip is then separated in the intermediate spaces between two neighboring conductor tracks.

6 Claims, 2 Drawing Sheets

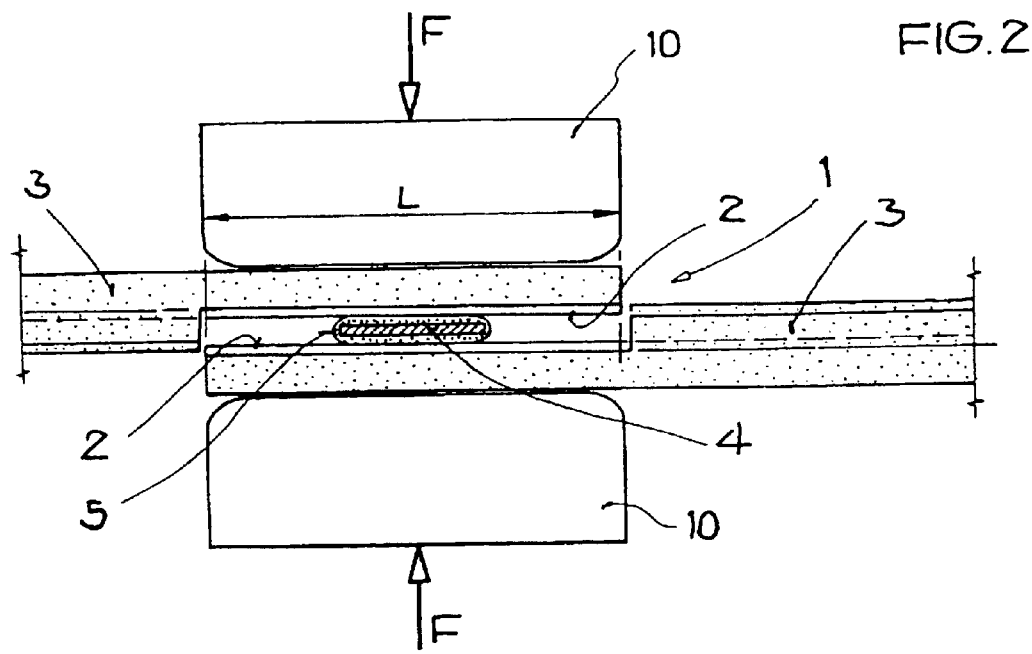
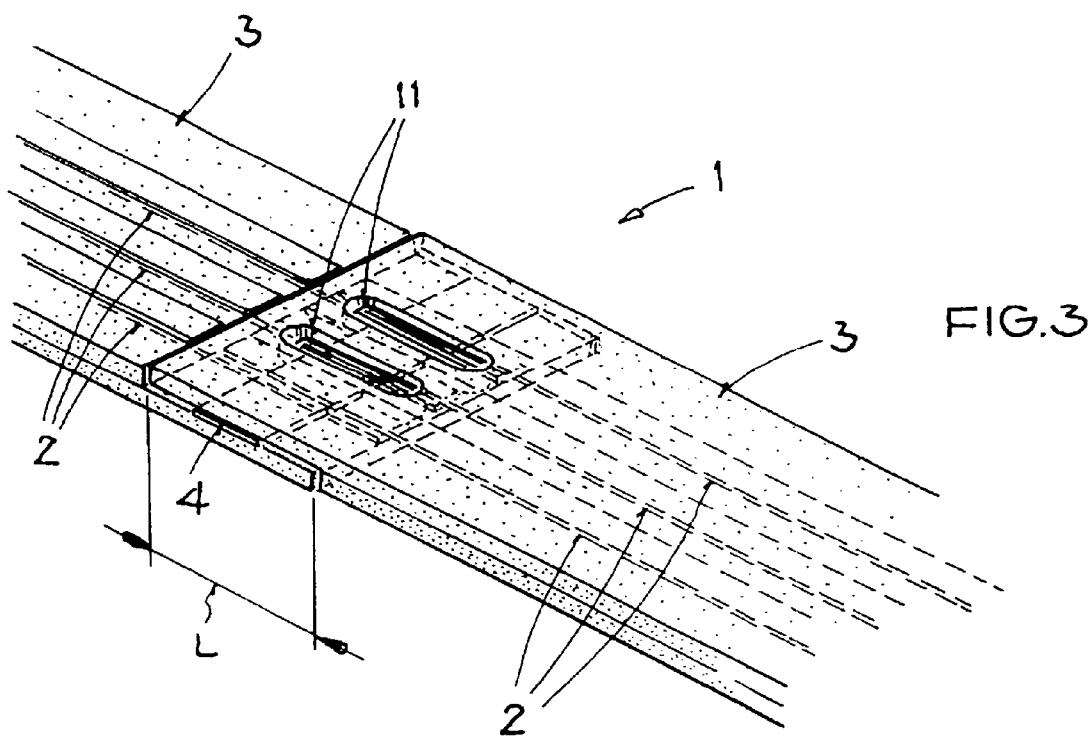

METHOD FOR CONNECTING FLAT FILM CABLES

This application claims the priority of German patent application 10050 798.0, filed Oct. 13, 2000 (PCT International Application No. PCT/EP01/10050 filed Oct. 13, 2000), the disclosure of which is expressly incorporated by reference herein.

BACKGROUND AND SUMMARY OF THE INVENTION

The invention relates to a method for connecting two flat laminated cable ends.

In motor vehicle construction, so-called flat laminated cables or FLCs are used with increasing frequency. As used herein, and as understood internationally, flat laminated cables are flat cables in which a multiplicity of parallel film-like conductor tracks are arranged between two insulating plastic laminates.

JP 07326404 A (Patent Abstracts of Japan (CD-ROM), Vol. 95, No. 12) proposes connecting flat laminated cables by incorporating electrically conducting powder in the plastic laminate at the cable ends. For connection, the flat laminated cables are laid exactly one on top of the other at their ends, so that the conductor tracks of one cable come to lie over the conductor tracks of the other cable. The cable ends are then pressed onto each other and heated, so that the plastic laminate over the conductor tracks melts locally and the incorporated metal powder establishes the electrical contact between the assigned conductor tracks.

In JP 11149951 A (Patent Abstracts of Japan 1999), it is proposed to prefabricate the ends of flat laminated cables to make it possible for two flat laminated cables to be connected. The flat laminated cable ends are stripped of insulation on one side, so that the conductor tracks protrude bare from the film substrates. Moreover, the conductor tracks are angled away at the ends of the flat laminated cable approximately by an angle of 45° with respect to the longitudinal direction of the flat laminated cable. As a result, when the stripped sides of two flat laminated cable ends are laid one on top of the other, the conductor tracks of the first flat laminated cable cross over the conductor tracks of the second flat laminated cable. By virtue of the crossing of the conductor tracks, the two flat laminated cables do not have to be aligned exactly flush to allow the conductor tracks to be connected to one another.

For cabling electrical devices in motor vehicles, these methods of connection are suitable only if the length of the flat laminated cable is prefabricated; if it must shortened even slightly, or if a longer flat laminated cable is required, the ends of the flat laminated cables can no longer be connected by the methods described above.

One object of the invention is to provide a method of connecting two flat laminated cables in which flat laminated cables as roll stock can be used, and the ends of the flat laminated cables can be connected without being prefabricated.

This and other objects and advantages are achieved according to the invention by placing a metal strip, tin-plated with a solder coating, transversely over the conductor tracks between the two flat laminated cable ends, pressing the flat laminated cable ends onto each other with the tin-plated metal strip lying in between, applying current to the metal strip and heating it until the solder of the metal strip melts and enters into a soldered connection with the conductor tracks of the flat laminated cables. After the soldered connection, the metal strip is separated or severed in the intermediate spaces between neighboring conductor tracks.

The advantage of this method is that it provides a simple and reliable way to make a proven soldered connection of the conductor tracks to one another. Soldered connections, particularly soft-soldered connections, can be reliably and permanently produced even at temperatures below 230° C. Since the heat transmission from the tin-plated metal strip to the conductor tracks is especially great at the point at which it rests on them, the flat laminated cable is locally heated, as desired, particularly at the location of the conductor tracks to be connected. Therefore, melting of the plastic laminate over a large surface area does not take place and the insulating and protecting function of the plastic laminate is preserved even in the connecting region of the two flat laminated cable ends.

Other objects, advantages and novel features of the present invention will become apparent from the following detailed description of the invention when considered in conjunction with the accompanying drawings.

BRIEF DESCRIPTION OF THE DRAWINGS

FIG. 2 is a side view of the connecting point in sectional representation;

FIG. 3 shows a perspective view of a finished connection with punched holes between the conductor tracks.

DETAILED DESCRIPTION OF THE DRAWINGS

Figure 1:
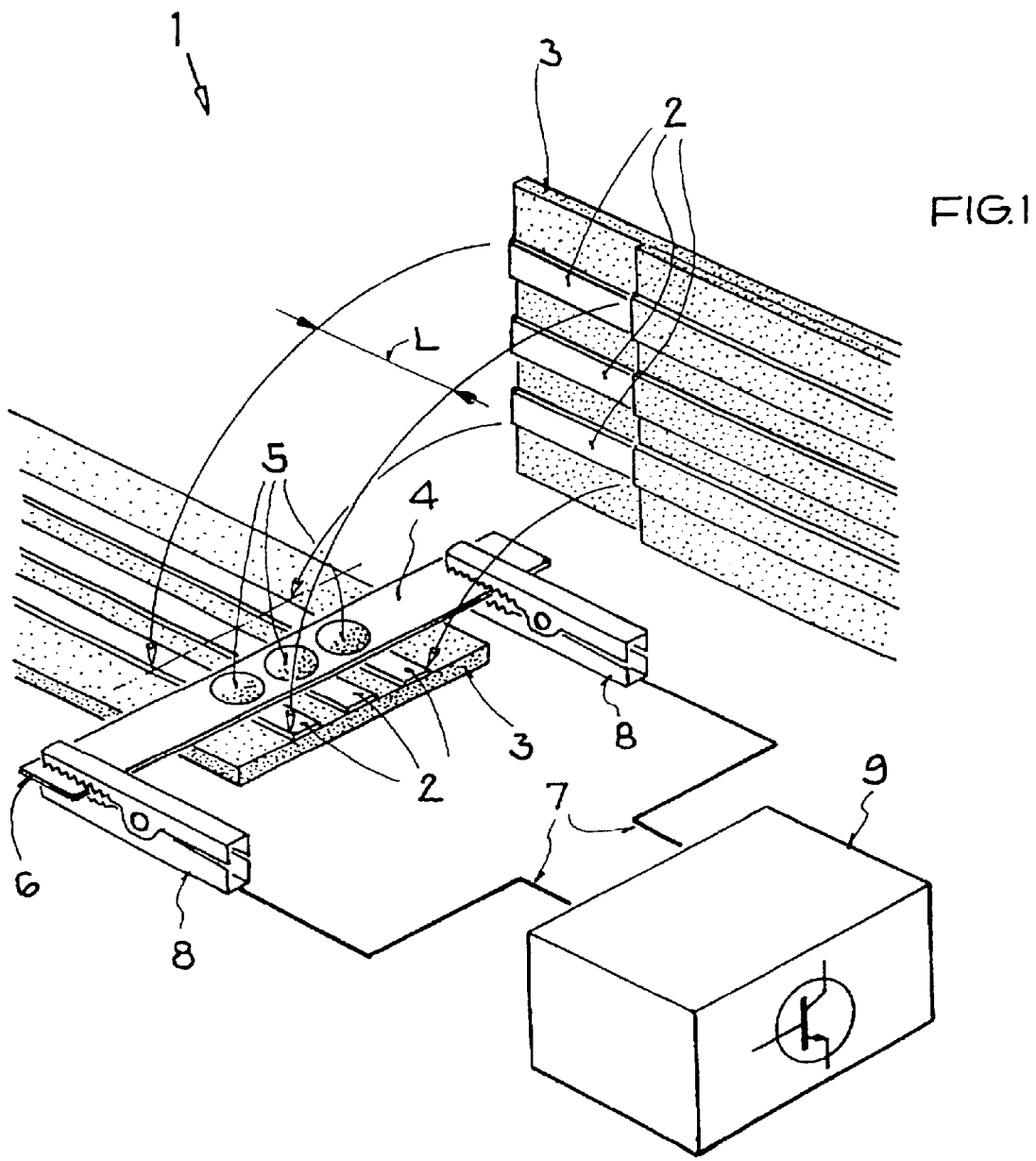
FIG. 1 is an exploded representation of two flat laminated cable ends with a metal strip, which is at least partly covered with a solder coating.

FIG. 1 shows two flat laminated cable ends 1, which are to be connected to each other. In a multi-layered plastic laminate 3, a multiplicity of film-like conductor tracks 2 are arranged in each flat laminated cable. In the embodiment shown, by way of example only, three conductor tracks are arranged by way of example in each flat laminated cable. Flat laminated cables with five or ten conductor tracks also exist and can likewise be connected to each other by the method according to the invention. To connect the cable ends, they must overlap over a certain length L. There are no prescribed values for the length of overlap L. For practical handling, however, lengths of overlap in the centimeter range have proven successful. In the overlapping region, the flat laminated cable ends are respectively stripped of insulation on one side, so that in this overlapping region the metal strips protrude from the laminate with a free metallic surface. Before the flat laminated cable ends are connected, a metal strip 4 that is tin-plated completely with a solder coating is placed between the cable ends to be connected, in the region of the overlap. The metal strip 4 is placed transversely over the cable ends, so that it crosses the conductor tracks 2 as far as possible at right angles and overhangs on the longitudinal sides of the cable ends.

If the number of conductor tracks in the flat laminated cables is known in advance, it is possible in an alternative embodiment for the tin-plated metal strip to be provided with solder points 5, which either replace or locally reinforce the solder coating of the metal strip. The spacing of the solder points 5 must then be made to match the spacings of the conductor tracks 2 in the flat laminated cables. The tin-plated metal strip 4 must then also be positioned between the cable ends in such a way that the solder points 5 come to lie over the conductor tracks 2.

When the metal strip 4 tin-plated with a solder has been positioned between the flat laminated cable ends 1, the previously prepared flat laminated cable ends, stripped of insulation on one side, can be laid one on top of the other in the overlapping region with a form fit and fixed, for example by a clamping device represented in FIG. 2. In a further method step, current supply lines 7 are attached to the two overhanging ends 6 of the metal strip 4. Since these current supply lines are required only for a short time, it is practical for them to be attached respectively to the two ends of the tin-plated metal strip 4 by a clamping connector 8. A power supply unit 9, represented by way of example and having integrated power electronics, serves for supplying current, for controlling the current supply and for wiring the supply lines.

The further method steps according to the invention are explained on the basis of FIG. 2. When the preparatory method steps in connection with FIG. 1 have been completed, the actual connecting of the flat laminated cable ends 1 can take place. In FIG. 2, the flat laminated cable ends 1 are shown in a sectional representation with a view from the longitudinal sides of the flat laminated cables. The conductor tracks 2 are embedded in a plastic laminate 3. Only in the overlapping region of the flat laminated cable ends has a layer of the plastic laminate been removed at each end, so that the conductor tracks are raised on the remaining second plastic laminate layer, protruding with a free stripped surface. In the sectional diagram, this produces a three-layered construction of the flat laminated cable. In a manner corresponding to the preparatory measures, the cable ends are laid overlapping one on top of the other with a form fit, and fixed with a clamping device 10, with a tin-plated metal strip arranged between the cable ends.

For connecting the conductor tracks, current is applied to the metal strip 4 tin-plated with solder, so that it heats up. The metal conductor is initially heated up to the soldering temperature of the solder coating used, until a soldered connection has formed between the lower and upper conductor tracks 2 and the metal strip 4. To assist the soldered connection, the two flat laminated cable ends may be pressed onto each other with a force F by a clamping device 10. The current flow in the metal strip 4 can then be switched off again, so that the soldered connections can solidify.

In a final method step, for the explanation of which FIG. 3 is used, the metal strip 4 is severed via punched-out openings 11 in the region of the plastic laminate portions, separating the conductor tracks, and the ends of the metal strip 4 overhanging on the longitudinal sides are cut off. That is, immediately after the soldered connection has taken place, the metal strip 4 bridges the individual conductor tracks 2 of the flat laminated cable in the transverse direction, and consequently short-circuits it. This short circuit between the conductor tracks must be broken. For this purpose, the metal strip is separated at a suitable location between the conductor tracks, for example by punching clearances into it. (The punching tools are not represented.) The punching tools are expediently already integrated in the clamping device 10 represented in FIG. 2.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for connecting ends of two flat laminated cables, each of which has a multiplicity of film-like conductor tracks arranged in a plastic laminate insulation, said method comprising:

stripping insulation on one side in an overlapping region of each of the two flat laminated cable ends;

placing a metal strip at least partly covered with a solder coating, transversely to the conductor tracks, between the flat laminated cable ends laid one on top of the other with a form fit;

connecting overhanging ends of the metal strip to a controllable electric current supply;

heating the metal strip to a melting temperature of the solder coating by applying an electric current to the metal strip, until a soldered connection has formed between each of the conductor tracks and the metal strip lying in between;

disconnecting the current supply; and severing the metal strip in a region of the plastic laminate portions, thereby separating the conductor tracks.

2. The method as claimed in claim 1, wherein, the severing step comprises punching gaps into the metal strip in regions of the plastic laminate portions between the conductor tracks.

3. The method as claimed in claim 2, wherein the metal strip is completely covered with a solder coating.

4. The method as claimed in claim 2, wherein the metal strip is only covered with solder points.

5. The method as claimed in claim 1, wherein the metal strip is completely covered with a solder coating.

6. The method as claimed in claim 1, wherein the metal strip is only partly covered with solder points.

* * * * *